United States Patent
Wuu et al.

[11] Patent Number: 6,025,209
[45] Date of Patent: Feb. 15, 2000

[54] DEEP GROOVE STRUCTURE FOR SEMICONDUCTORS

[75] Inventors: Dong-Sing Wuu; Ten-Hsing Jaw, both of Hsinchu, Taiwan

[73] Assignee: Industrial Technology Research Institute, Hsinchu, Taiwan

[21] Appl. No.: 08/909,090

[22] Filed: Aug. 12, 1997

[51] Int. Cl.$^7$ .............................. G01L 9/00; G01L 9/08; H01L 21/465

[52] U.S. Cl. ............................................. 438/53; 438/700

[58] Field of Search ................................. 438/52, 53, 700, 438/701; 73/777, 754; 148/DIG. 73; 361/283.2, 283.4; 310/324

[56] References Cited

U.S. PATENT DOCUMENTS

| | | | |
|---|---|---|---|
| 4,989,059 | 1/1991 | Micheels et al. | 357/30 |
| 5,316,965 | 5/1994 | Philipossian et al. | 437/70 |
| 5,471,552 | 11/1995 | Wuu et al. | 385/489 |
| 5,578,528 | 11/1996 | Wuu et al. | 437/228 |
| 5,600,745 | 2/1997 | Wuu et al. | 385/49 |

FOREIGN PATENT DOCUMENTS

| | | |
|---|---|---|
| 63-311147 | 12/1988 | Japan . |
| 6-163941 | 6/1994 | Japan . |

OTHER PUBLICATIONS

Huff, Michael et al., "Design of Sealed Cavity Microstructures Formed by Silicon Wafer Bonding", Journal of Microelectromechanical systems, vol. 2, No. 2, pp. 74–81, Jun. 1993.

*Primary Examiner*—Charles Bowers
*Assistant Examiner*—Matthew Whipple
*Attorney, Agent, or Firm*—Bacon & Thomas, PLLC

[57] ABSTRACT

Deep groove structure for semiconductors comprising a semiconductor substrate, a groove or a cavity formed in said semiconductor substrate and a suspending glass membrane formed on the groove or deep cavity, prepared by a flame hydrolysis deposition process. The suspending glass membrane functions as a planarization structure and has surface at the same level of the surface of the semiconductor substrate. The present invention also discloses a method to prepare the deep groove structure.

12 Claims, 3 Drawing Sheets

Etched Groove

Glass Soot Deposition

H2
O2
Halides
Torch
Glass Soot

Sintering

Transparent Glass Membrane

Polish or Etch Back

Sacrificial Membrane
Si

DEEP GROOVE STRUCTURE FOR SEMICONDUCTORS

FIELD OF THE INVENTION

The present invention relates to a deep groove structure for semiconductors and the method to prepare the deep groove in semiconductors, especially to a method for the planarization of deep grooves on semiconductor substrates and the structure so prepared.

BACKGROUND OF THE INVENTION

In the micro-electro-mechanic systems, the preparation of deep grooves or deep cavities in the semiconductor material, such as a silicon dice, is very important. The applications of such deep groove and cavity structure include forming a micro fluid channel in the micro structure of silicon dice. In the preparation of grooves or cavities which are as deep as tens of micrometers, the planarization of the grooves or cavities is always a great task. Difficulties are noted especially when the micro fluid channels are as deep as about 30 μm.

In the conventional art, there are four major approaches in the planarization of the deep groove or deep cavity structures. They are:

1. Dual photoresist and two-step etching technology. In this approach, a first photoresist layer is filled within the shallow trench formed on the dice and then a second layer of photoresist is applied on the surface of the dice for the whole area. After a two-step etching process, a planarization structure may be formed on the dice. (See U.S. Pat. No. 5,516,625, "Fill and etch back process using dual photoresist sacrificial layer and two-step etching process for planarizing oxide-filled shallow trench structure.")
2. Spin-on glass (SOG) planarization: In this approach, a layer of SOG is applied on an assembly of multilevel die and the assembly is etched such that the etching rate of the SOG layer is the same as that of the dielectric layer under the SOG layer. As a result, a planar surface may be formed on the rugged surface of the die. A second dielectric layer is then deposited and the planarization is achieved. (See U.S. Pat. No. 4,676,867, "Planarization process for double metal MOS using spin-on glass as a sacrificial layer")
3. Silicon fusion-bonding technology: In this approach, the planarization structure of deep grooves may be obtained by using silicon fusion bonding technology. (See K. Petersen et al., "Silicon fusion bonding for pressure sensors", Tech. Dig. IEEE Solids-State Sensors Workshop, SC, pp. 144–147, 1988.)
4. Sacrificial wafer bonding technology: In this approach, the planarization structure of deep grooves or cavities can be formed using sacrificial wafer bonding technology. (See V. L. Spiering et al., "Sacrificial wafer bonding for planarization after very deep etching", J. Microelectromechanical Systems, 4, pp. 151–157, 1995.)

Among the above-mentioned approaches, the first two may not be applied in the planarization of grooves or cavities as deep as tens of micrometers. Although the latter two approaches may be applied to deep groove structures, they inherent some disadvantages. As describe above, in the latter approaches, grooves or cavities are formed on the silicon substrate first and a planarization layer is bonded onto the substrate. During the bonding of the planarization layer, the environment shall be strictly clean. In addition to this, both approaches are very sensitive to the surface treatment processing conditions of the die. As a result, complicated preparation processes and high preparation cost are inevitable.

It is thus a need in the industry to provide a novel planarization technology to be applicable to deep groove or deep cavity structures formed in semiconductor substrates.

It is also a need to have a simplified planarization technology for deep groove or deep cavity structures for semiconductors.

OBJECTIVES OF THE INVENTION

The purpose of the present invention is to provide a novel technology for the planarization of deep groove or deep cavity structures formed in semiconductors.

Another purpose of this invention is to provide a simplified approach for the planarization of deep groove or deep cavity structures in semiconductor substrates.

Another purpose of this invention is to provide a novel deep groove structure for semiconductors.

SUMMARY OF THE INVENTION

According to the present invention, a suspending glass membrane may be formed on deep grooves or deep cavities in the semiconductor substrate by using flame hydrolysis deposition. In the deep groove structure so prepared, the planarization glass membrane may be formed at the same plane of the semiconductor substrate. Using the invented approach, a semiconductor microstructure with enhanced mechanical structure may be achieved. The preparation of the planarization layer is not sensitive to the environment. The deep groove so prepared may be used as micro fluid channel. The deep groove assembly may be further processed to function as sensors, actuators etc.

The above and other purposes and advantages of the present invention may be clearly understood from the detailed description of the invention by referring to the following drawings.

In the drawings.

DETAILED DESCRIPTION OF THE INVENTION

The following is a detailed description of the embodiment of the deep groove structure for semiconductors of this invention. While the present invention is applicable to both deep groove structure and deep cavity structure and other similar structure for semiconductors, in the detailed description the term "deep groove" will be used to include deep groove and deep cavity and other similar structure.

Figure 1A:
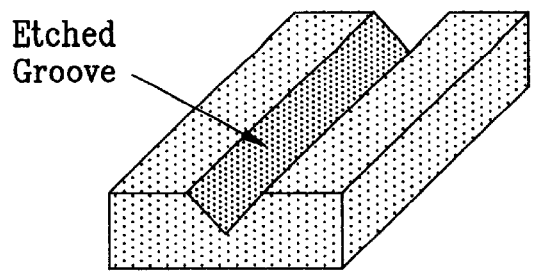
FIG. 1 illustrates the stepping chart for the preparation of the deep groove structure for semiconductors of this invention.
Figure 1B:
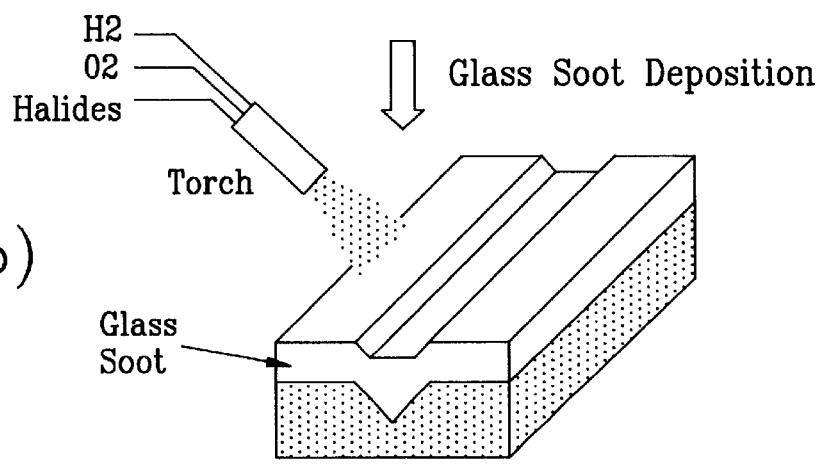
Figure 1C:
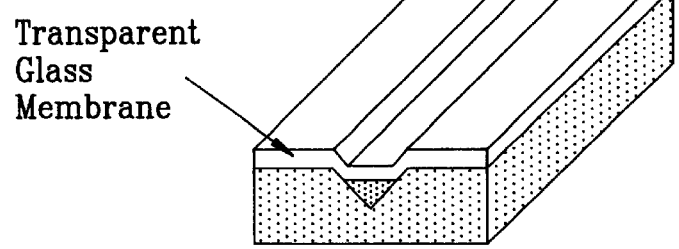
Figure 1D:
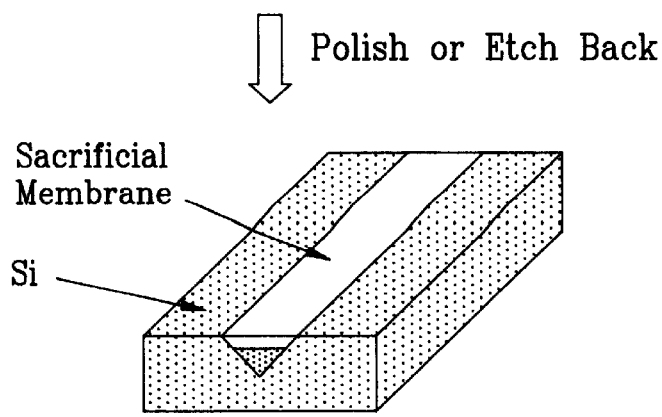
Figure 2:
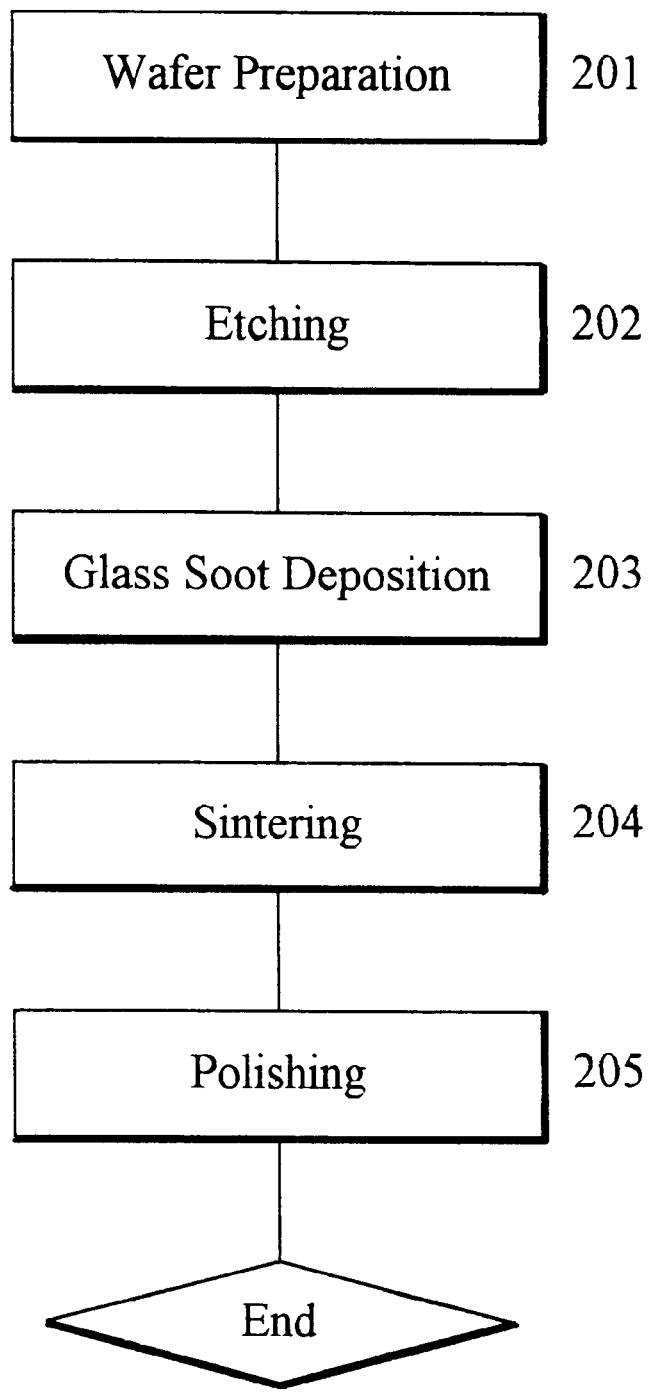
FIG. 2 illustrates the flow chart for the preparation of the deep groove structure for semiconductors of this invention.

FIG. 1 illustrates the stepping chart for the preparation of the deep groove structure for semiconductors of this invention. FIG. 2 illustrates the flow chart for the preparation of the deep groove structure for semiconductors of this invention. The following detailed description will follow the sequence shown in FIG. 2 and FIG. 1 will be referred to to show the result of every step.

As shown in FIG. 2, first at 201 a 4 inch (100) silicon wafer is prepared. At 202 a mask prepared through thermal oxidation process is prepared on the silicon wafer and a V shaped deep groove is formed by etching the silicon wafer with anisotropic etchants. The result is shown in FIG. 1 at (a).

During the etching process, the etchant may be 50 g KOH in 100 ml pure water. The etching condition may be 80° C. Other etchants and etching conditions may also be employed.

At 203 glass soot is deposited and fill in the V shape groove, as shown in (b) in FIG. 1. The thickness of the glass soot may be about 400 $\mu$m. In the deposition of the glass soot, the flame hydrolysis deposition method may be employed. U.S. Pat. No. 3,711,262 disclosed a "flame hydrolysis deposition for optical fiber fabrication". The theory and the processes disclosed in this patent may be taken for reference.

While the flame hydrolysis deposition is used, a torch with multiple coaxial quartz tubes may be employed. The outer tube is supplied with oxy-hydrogen gas and the inner tube is supplied with $SiCl_4$, $BBr_3$ and $POCl_3$. The wafers are positioned on a turntable and the torch is ignited and scans the turntable along its radian direction so that the glass soot may be deposited on the die.

The reaction conditions of the deposition may be as follows:

$H_2$: 8 slm (supplier of the oxy-hydrogen flame).
$O_2$: 16 slm (supplier of the oxy-hydrogen flame).
$SiCl_4$ (20° C.): 400 sccm $SiCl_4+2H_2O\rightarrow SiO_2+4HCl$.
$BBr_3$ (30° C.): 180 sccm $2BBr_3+3H_2O\rightarrow B_2O_3+6$ HBr.
$POCl_3$ (20° C.): 50 sccm $2POC_3+3H_2O\rightarrow P_2O_5+6$ HC.

Other methods with which a suspending glass membrane can be formed on the V shape groove may be employed in this invention. The suspending membrane may also be made of any suited material, without limitation to glass.

At 204 the substrates are sintered under a high temperature. The sinter may be conducted in a high-temperature furnace, under the temperature of, for example, about 950° C. The glass soot after sinter will form a transparent isolating membrane, as shown in (c) in FIG. 1. Although it is not intended to limit the scope of this invention, the porous glass soot which filled the V shape groove is consolidated due to the high sintering temperature. The volume of the glass soot may be reduced to about 1/20 after sintering. For example, if the thickness of the glass soot is 200 $\mu$m, the thickness of the isolation membrane would be about 20 $\mu$m.

Since the glass soot is of porous state, oxygen atoms will exits in the glass soot. During the sintering, however, the oxygen gas may not escape from the space between the V shape groove and the glass membrane. This is because of the low diffusion rate of the oxygen gas in the glass material; Even under 950° C., the diffusion depth of oxygen gas in glass material will be less than 1 $\mu$m within the period of 1 hour. As to the glass membrane, the surface tension forces the glass forces to reduce its surface area so that the glass membrane will be isolated from the walls of the V shape groove. A suspending glass membrane is thus formed.

Figure 3A:
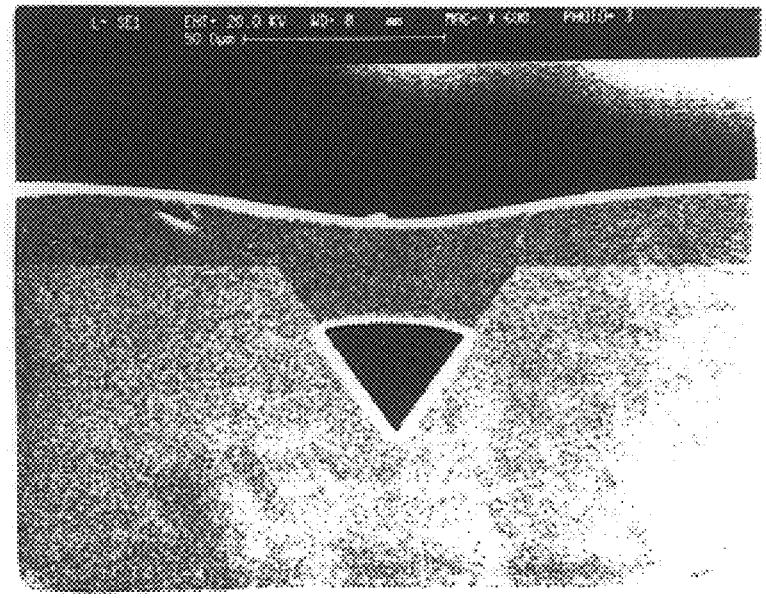
FIG. 3 is a photograph under a microscope showing the sectional view of the deep groove structure for semiconductors prepared according to the method of this invention.
Figure 3B:
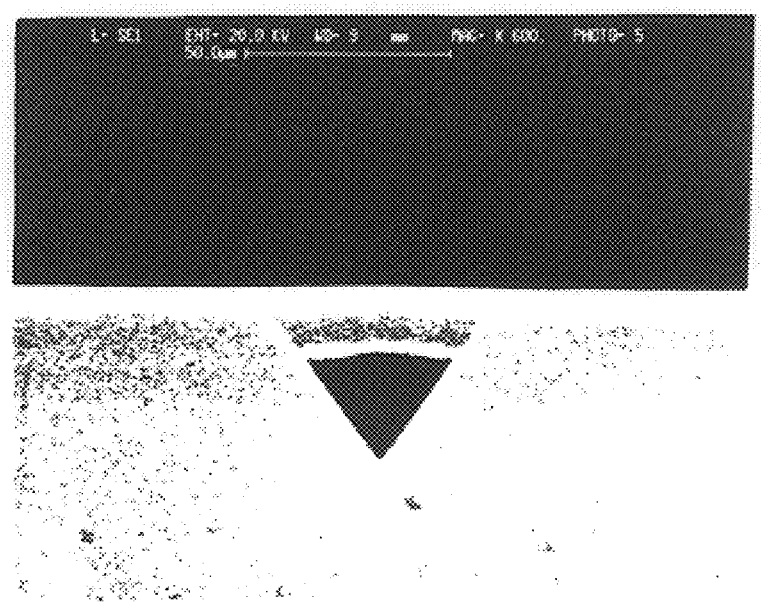

At 205 the surface of the die is subject to polish process. Polish may be mechanical polish or chemical etching. It is recommended that the glass membrane is polished such that the surface of the silicon is exposed, as shown in (d) of FIG. 1. FIG. 3 shows the sectional view of a planarized deep groove structure so prepared.

As shown in FIG. 3, the planarization glass membrane has surface which is at the same level with the surface of the dice. This brand new structure of deep groove is very advantageous in view of the preservation and processing of the die. The mechanical strength of the new structure is higher than the conventional bonding structure.

The deep groove structure so prepared may provide the function of micro fluid channel. The die may be further processed with etching or bonding to provide articular functions, such as sensors, circuitry, actuators etc.

EFFECTS OF THE INVENTION

The advantages of the present invention include:

1. No bonding process is used in the planarization of the deep groove structure as deep as tens of micrometers. The new structure provides high mechanical strength. The preparation of the deep groove structure is less sensitive to the preparation environment.

2. The isolation membrane so prepared has surface at the same level of the surface of the dice. Higher flexibility in the following processing is thus achieved.

As the present invention has been shown and described with reference to a preferred embodiment thereof, those skilled in the art will recognize that the above and other changes may be made therein without departing from the spirit and scope of the invention.

What is claimed is:

1. A method for the preparation of grooves in a semiconductor substrate comprising the following steps:

preparing a semiconductor substrate:

forming at least one groove in said semiconductor substrate;

forming a membrane structure on said at least one groove and its annexed area on the surface of said substrate;

heat processing said membrane structure to consolidate said membrane such that a space is formed between said condensed membrane and the bottom of said groove; and surface-processing said condensed membrane, wherein the surface processing of said condensed membrane comprises removing at least the part of said membrane that is located above the surface of said semiconductor substrate.

2. The method according to claim 1 wherein the material of said membrane is glass.

3. The method according to claim 1 wherein said semiconductor substrate is etched to form said at least one groove.

4. The method according to claim 1 wherein said semiconductor substrate is processed with laser beams to form said at least one groove.

5. The method according to claim 1 wherein said semiconductor substrate is silicon substrate.

6. The method according to claim 1 wherein the thickness of the membrane is 20 $\mu$m.

7. A method for forming a cavity in a semiconductor substrate comprising the following steps:

preparing a semiconductor substrate;

forming a cavity in said semiconductor substrate;

forming a membrane structure on said cavity and its annexed area on the surface of said substrate;

heat processing said membrane structure to consolidate said membrane such that a space is formed between said condensed membrane and the bottom of said cavity; and surface-processing said condensed membrane, wherein the surface processing of said condensed membrane comprises removing at least the part of said membrane that is located above the surface of said semiconductor substrate.

8. The method according to claim 7 wherein the material of said membrane is glass.

9. The method according to claim 7 wherein said semiconductor substrate is etched to form said cavity.

10. The method according to claim 7 wherein said semiconductor substrate is processed with laser beams to form said cavity.

11. The method according to claim 7 wherein said semiconductor substrate is silicon substrate.

12. The method according to claim 7 wherein the wherein the thickness of the membrane is 20 µm.

* * * * *